United States Patent
Chen

(10) Patent No.: US 6,449,017 B1
(45) Date of Patent: Sep. 10, 2002

(54) RGB SELF-ALIGNMENT AND INTELLIGENT CLOCK RECOVERY

(76) Inventor: Ching-Chyi Thomas Chen, 1107 Bartlett Creek Ct., San Jose, CA (US) 95120

( * ) Notice: Subject to any disclaimer, the term of this patent is extended or adjusted under 35 U.S.C. 154(b) by 0 days.

(21) Appl. No.: 09/205,438

(22) Filed: Dec. 4, 1998

(51) Int. Cl.[7] .................................................. H03L 7/00

(52) U.S. Cl. ....................................... 348/539; 348/537

(58) Field of Search ................................ 348/536, 537, 348/538, 539, 540, 541, 542, 543, 510, 512, 513, 514, 516; H04N 5/12

(56) References Cited

U.S. PATENT DOCUMENTS

| | | | |
|---|---|---|---|
| 5,600,379 A | * | 2/1997 | Wagner ........................ 348/537 |
| 5,764,301 A | * | 6/1998 | Chapel ......................... 348/537 |
| 6,046,693 A | * | 4/2000 | Wu ............................. 348/537 |

* cited by examiner

*Primary Examiner*—Michael H. Lee
(74) *Attorney, Agent, or Firm*—Bo-In Lin

(57) ABSTRACT

A clock-recovery system is used to align a clock-phase with the RGB-signals. A frequency-synthesizing loop is applied for receiving a reference clock signal (CKREF) to generate a synthesized frequency. A fine-tuned frequency-synthesizing loop then receives a horizontal synchronization signal (HSYNC) to fine-tune the synthesized frequency into a fine-tuned synthesized frequency. A phase divider subdivides the fine-tuned synthesized frequency into a multiple phase segments for inputting to a multiplex controller. An analog sensor, receives and senses the RGB signals for generating encoded sensing data corresponding to voltage transitions of the RGB signals. A transition detector then applies the encoded sensing data for generating transition-detection data. A threshold triggering circuit compares the transition-detection data with a threshold data and triggering a RGB-phase data upon detecting the threshold data is exceeded by the transition detection data. A phase sampling detector applies the RGB-phase data for selecting a clock-alignment phase-segment from one of the multiple phase segments received from the multiplex controller for aligning the clock-phase. A digital phase-lock loop (PLL) includes a phase shift-direction detector (PD) receives the RGB-phase data from the threshold triggering circuit and the clock-alignment phase-segment from the multiplex controller for generating a dynamic phase-shift difference. The digital PLL further includes a digital filter to receive the dynamic phase-shift difference from the PD for generating a phase-segment-shift signal for outputting to the multiplex controller for shifting the clock-alignment phase-segment to dynamically align the clock-phase.

17 Claims, 3 Drawing Sheets

RGB SELF-ALIGNMENT AND INTELLIGENT CLOCK RECOVERY

BACKGROUND OF THE INVENTION

1. Field of the Invention

This invention relates generally to a clock recovery system for synchronizing color graphic image display. More particularly, this invention relates to an intelligent and independent analog signal interface controller provided with self-alignment to analogy signals and intelligent and dynamic phase tracking for continuous periodical clock recovery.

2. Description of the Prior Art

Several technical difficulties are faced by those who apply state of art technology in providing a LCD control card to display color images on a liquid crystal display (LCD) panel. These technical difficulties are caused by many uncharacterized factors now exist in current technology for analog-digital signal interfaces. Specifically, these uncharacterized factors are resulting from 1) the frequency f1 of the analog signals from the graphic card is not available to the LCD control card; 2) the jitters of the phase shift between frequency f1 of the graph card and the LCD control card f2, especially the long term jitters generated by phase shifts in two separate systems; 3) analog signal distortions in transmitting from the graphic card to the LCD control card; 4) HSYNC (n f1) received from graphic control card is non-integral clock cycles of local clock (f2) since f2 is not exactly equal to f1; 5) relative frequency shift; and 6) the uncharacterized timing relationship between a horizontal synchronization signal (HSYNC) and the analog RGB signals. These technical difficulties lead to several design and image display problems, which are not resolved by those of ordinary skill in the art.

A first problem encountered by a LCD control card designer is the difficulties in dealing with the sampling of the analog signals. Due to these uncharacterized factors, sampling of analog signals becomes very sensitive to clock phase, clock jitter, and clock accuracy. However, jitters generated by relative frequency and relative phase shifts prevent accurate sampling of the analog signals. This leads to poor display image quality and degraded performance in processing the analog signals by an LCD control card. Image distortions in space, time and gray scale are produced due to sampling errors. Uneven and blurred edges are shown on vertical lines in displaying the images. Loss of edge sharpness of the graphic images is produced. Uneven sampling from frame to frame is also a problem caused by variations of the analog RGB data received from the graphic controller. Several systems are now available in the market in attempt to resolve these problems by a method of manually make an on-screen selection (OSD). But an OSD manual adjustment cannot handle the more dynamic variations and cannot optimize the phase margins due to the limitations that human eyes cannot identify 180 phase of the RGB signals. The phase margin selected by the OSD method cannot assure sufficient margins are provided to cover different conditions that may cause the frequency and phase to shift.

In an A/D converter provided by Genlock, for video application, the incoming video stream signals are tracked to detect the SYNC signals. As the SYNC signals are in synchronization with the phase of the incoming video signals, the detected SYNC signals are employed to generate a new clock phase to line-up with the video signal phase. Since the SYNC signals must be generated separately, standard output signals provided by regular CRT graphic cards cannot be included in by a LCD control card implemented with Genlock converter.

In a system provided by Read/Write Channel, the digital data are coded. Transitions of digital data can be easily detected. A pulse can be generated in alignment with a transition of digital data. The pulse can be employed as a reference phase for aligning the clock phase. The frequency is then determined by applying the elapsed time between the pulses generated according to the digital data transitions. Again, as that incurred in Genlock system, the coded digital data must be generated separately, standard output signals provided by regular CRT graphic cards cannot be employed directly by an LCD control card implemented with Read/Write clock recovery system.

Therefore, a need still exists in the art of digital flat-panel image display to provide a clock recovery system and method to resolve the problems discussed above. Specifically, it is desirable to provide a novel method and an intelligent clock recovery system to achieve self-alignment between the clock and the RGB image data. It is further desirable that the self-alignment with the RGB data can be achieved by employing a standard RGB DIN connector used for conventional CRT display. Connectors for regular CRT can be directly employed for connecting to a LCD graphic control card for a digital LCD monitor without requiring a separate signal processor and data transceiver as that required in Genlock and Read/Write Channel such that simple and low cost implementation can be achieved.

SUMMARY OF THE PRESENT INVENTION

It is therefore an object of the present invention to provide a new clock recovery system without relying on clock signals provided from a RAMDAC card. Therefore, the aforementioned difficulties and limitations caused by uncharacterized parameters in the prior art can be overcome.

Specifically, it is an object of the present invention to provide a new configuration and method for a clock recovery system where the phase and frequency are determined by employing the real time image data. The uncertainties and distortions caused by phase and frequency drifts and deviations caused by random phase, jitters over a period of time between real-time analog data and local generated clock for A/D converter are eliminated.

Another object of the present invention is to provide a new clock-recovery system implemented with novel configuration and method where an automatic phase alignment to the incoming RGB signals and HSYNC are performed dynamically and automatically. The technical difficulties leading to poor quality of video images caused by the uncharacterized parameters as discussed above are therefore eliminated.

Another object of the present invention is to provide new clock-recovery system implemented with novel configuration and method where an automatic phase alignment to the incoming RGB signals and HSYNC is performed at 180Y of the RGB signals to allow more phase variations due to inaccurate frequency from the RAMDAC clock Greater tolerances for RAMDAC frequency inaccuracies are provided without causing additional deviations of phase alignment within the greater tolerance limits.

Another object of the present invention is to provide a new clock-recovery system implemented with novel configuration and method where an automatic phase alignment to the incoming RGB signals and HSYNC are performed dynamically and automatically. Conventional on-screen-selection (OSD) to align the phase by a manual tuning is no longer necessary and can be provided only as an option. The manual phase tuning can be provided to override the automatically phase alignment according to a user's preference if an OSD option is selected.

Briefly, in a preferred embodiment, the present invention discloses a clock recovery system for aligning a clock-phase with RGB signals. The clock recovery system includes a voltage transition detector for detecting consecutive voltage transitions from receiving the RGB signals. The clock recovery system further includes a phase-selection means for applying the times detected for the voltage transitions for latching the clock-phase of the A/D converter to a phase angle of the RGB signals. In a preferred embodiment, the clock-phase of the A/D converter is latched to a half-cycle phase, i.e., 180Y phase-angle, according to the detected times of the voltage transitions from receiving the RGB signals. The time recovery system further includes a RGB analog signal sensor tracking with an preamplifier of an A/D converter. It further includes a digital phase lock loop (PLL) for carrying out a dynamic RGB phase-segment selection update for adjusting the A/D clock by making a left-or-right phase-shift operation to dynamically and continuously correct random phase jitters.

In a specific embodiment, this invention discloses a clock recovery system for aligning a clock-phase with RGB signals. The clock recovery system includes a frequency-synthesizing loop for receiving a reference clock signal (CKREF) to generate a synthesized frequency. The clock recovery system further includes a fine-tuned frequency synthesizing loop for receiving a horizontal synchronization signal (HSYNC) to fine tune the synthesized frequency into a fine-tuned synthesized frequency. The clock recovery system further includes a phase divider for subdividing the fine-tuned synthesized frequency into a multiple phase segments for inputting to the multiplex controller. The clock recovery system further includes a multiplex controller for receiving the multiple phase-segments subdivided. The clock recovery system further includes an analog sensor for receiving and sensing the RGB signals for generating encoded sensing data corresponding to voltage transitions of the RGB signals. The clock recovery system further includes a transition detection means for applying the encoded sensing data for generating transition-detection data. The clock recovery system further includes a threshold triggering circuit for comparing the transition-detection data with a threshold data and triggering a RGB-phase data upon detecting the threshold data is exceeded by the transition detection data. The clock recovery system further includes a phase sampling means for applying the RGB-phase data for selecting a clock-alignment phase-segment from one of the multiple phase segments received from the multiplex controller for aligning the clock-phase. The clock recovery system further includes a digital phase-lock loop (PLL) includes a phase shift-direction detector (PD) for receiving the RGB-phase data from the threshold triggering circuit and the clock-alignment phase-segment from the multiplex controller for generating a dynamic phase-shift difference. The digital PLL further includes a digital filter for receiving the dynamic phase-shift difference from the PD for generating a phase-segment-shift signal for outputting to the multiplex controller for shifting the clock-alignment phase-segment to dynamically align the clock-phase. This invention also discloses a method of processing red-green-blue (RGB) analog signals for converting said RGB analog signals to corresponding digital signals for image display. The method includes the steps of a) receiving a reference clock (CKREF) signal as a digital signal; b) generating a synthesized frequency (f2) by applying a phase-locking operation for locking a phase of the synthesized frequency with the reference clock (CKREF) signal; c) receiving horizontal synchronization (HSYN) signals as digital signals and generating a fine-tuned synthesized frequency (f2') by performing a phase locking operation to lock a phase of the fine tuned synthesized frequency with the HSYN signals; d) dividing the fine-tuned synthesized frequency (f2') into N'-equal phase-segments where N' is a positive integer; e) detecting at least two voltage transitions from receiving a series of the RGB analog signals and generating a clock-phase select signal for automatically selecting an auto-selected phase-segment among the N'-equal phase-segments for latching the fine-tuned synthesized frequency (f2'); and f) periodically detecting voltage transitions from receiving a series of the RGB analog signals after a predefined elapsed-time and generating a dynamic clock-phase select signal for periodically selecting an auto-selected phase-segment among the N-equal phase-segments to for latching the fine-tuned synthesized frequency (f2'). In a preferred embodiment, the method further includes a step of g) providing a static phase adjusting means to allow a user to select a user-selected phase segment among the N'-equal phase-segments to for latching the fine-tuned synthesized frequency (f2').

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
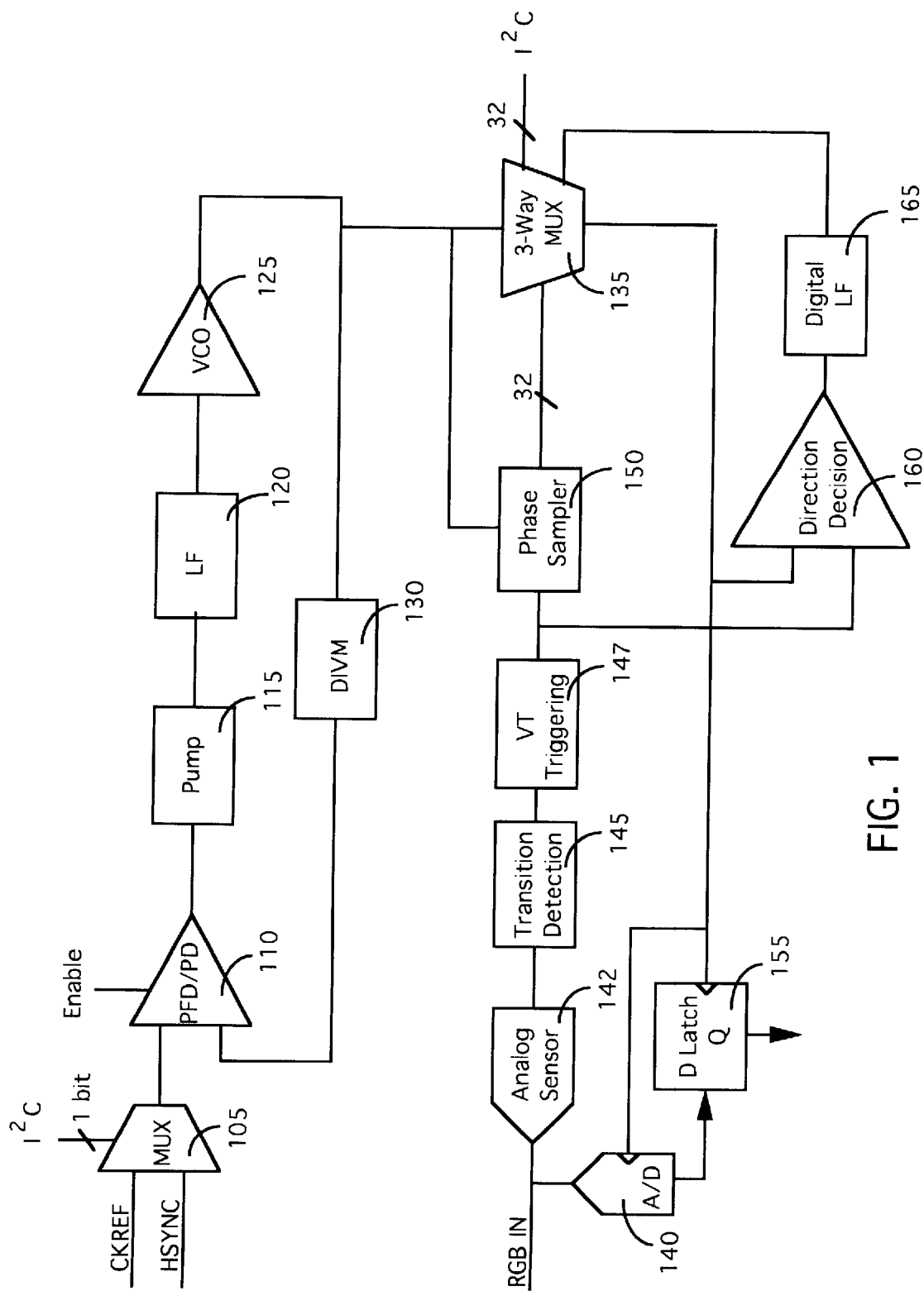
FIG. 1 is a functional block diagram of a clock recovery system of this invention.

Please refer to FIG. 1 for a functional block diagram of an improved phase alignment and clock recovery system 100 of this invention. Digital input signals of horizontal synchronization HSYN and a reference clock CKREF are first received by a multiplex controller 105. A one-bit I2C bus signal is applied to the multiplex controller 105. The horizontal synchronization signal HSYN is passed to a phase-frequency difference detector 110 when the I2C bus bit is one to perform a phase difference (PD) detection operation. And, the reference clock signal CKREF signal is passed to the phase-frequency difference detector when the I2C bus bit is zero to perform a frequency and phase difference (PFD) detection operation. The phase-frequency difference detector 110 generates a phase difference represented by Δt. The phase difference Δt generated by the phase-frequency difference detector 110 is charge-pumped by a pump circuit 115 to produce a voltage difference ΔV. The voltage difference ΔV is filtered by a loop filter 120 to eliminate the AC components of the voltage difference ΔV. The DC component of the voltage difference is inputted to a voltage controlled oscillator 125 to generate a frequency signal representing the phase-frequency discrepancy between the frequency of a synthesized frequency f2 with the frequency reference clock signal CKREF or between f2 and the horizontal synchronization signal HSYN. The output frequency from the voltage control oscillator VCO 125 is divided by an M-parameter received from the I2C bus by a dividing circuit 130. The output generated by the dividing circuit 130 is applied as a feedback signal for inputting to the phase-frequency difference detector 110 to complete a phase-lock loop (PLL) operation. The voltage-controlled oscillator 125 therefore generates a synthesized frequency, which is subdivided into thirty-two equally divided phase-segments. The synthesized frequency, now subdivided into a plurality of segments, is provided as input to a three-way multiplex controller 135. One of these thirty-two segments will be selected according to three selection-input received by the multiplex controller 135, which will be further described below.

One of the selection-input signals received by the three-way multiplex controller 135 is an on-screen-selection (OSD) input signal of five bits from the I2C bus. If this OSD user-selection input signal is a non-zero value, then a phase segment according to this non-zero value is selected. This user selection is an overriding signal to override two other user-selection input signals generated by automatic phase alignment processes to be further described below. If this OSD user-selection input is zero then the phase segment selection input generated from the automatic phase alignment processes is applied.

The automatic phase alignment processes start from receiving the RGB signals into an analog sensor 142 A/D converter 140 where the RGB signals are amplified and then converted to a differential complimentary output functioning as coded data providing signal transition information. A transition detector 145 detects the reception of the RGB signals where the voltage transitions from receiving the RGB image signals are detected. After detecting two consecutive voltage transitions, the detected signals are transmitted to a phase sampler 150 employed to select a phase-segment among the thirty-two phase segments aligned with the phase determined from the transitions as the results of receiving the RGB signals) The phase-segment number for the selected phase-segment is then transmitted to the three-way multiplex controller 135 as a phase-sampler selection input to the three-way multiplex controller 135. This selected phase-segment as one segment among thirty-two phase segments is then passed from the three-way multiplex controller 135 as a clock output signal (CKOUT) to a latch circuit 155. The digital signals generated from the A/D converter 140 are latched to this selected phase segment provided by the phase sampler 150 to provide the digitized RGB signals with precisely aligned phase for display on a digital image display panel. It is to be noted that the signals generated by the clock of the A/D converter 140 is not employed for RGB sampling as that commonly implemented in a conventional graphic control card. The clock of the A/D converter may not have a correct phase according to the incoming RGB signals. The clock of the A/D converter is then latched to the half-cycle, i.e., a phase angle of 180Y of the RGB signal cycles based on the timings detected for voltage transitions by the transition detector 145. The methodology of sensing the voltage transitions during the reception of RGB signals and latching the clock to the phase angle from the detected transitions is not obvious for a conventional A/D converter because the A/D clock is commonly used for RGB signal sampling and holding operations.

The method of applying RGB analog signal sensing for clock recovery is not obvious for the reason that a personal computer (PC) does not provide a test bit. The "pulses" of RGB signals must be detected to carry out to determine the phase of the analog RGB signals for static phase adjustment. However since the RGB swings can be random variations including the signal variations representing the least significant bits (LSB), the most significant bits (MSB), etc., furthermore, the delay time of an analog to digital conversion can also vary when there is no clock employed. The task for detecting the RGB signals for phase determination is quite difficult. Implementation of RGB sensing as the integrated circuits (ICs) requires higher level of signal processing algorithms and more sophisticate design skills. Therefore, the clock recovery system as disclosed in this invention is not obvious to those of ordinary skill in the art.

Furthermore, a phase shift-direction detector 160 also receives the CKOUT signal and the voltage transition detected by the transition detector 145. The phase shift-direction detector 160 compares and determines the phase deviation between the CKOUT and the phase detected by the transition detector 145 directly from the digitized of analog RGB signals generated by the RGB analog sensor 142. The phase difference is then inputted to a digital loop filter 165 to generate a phase segment selection input signal. The phase segment selection is inputted to the three-way multiplex controller 135 as an updated CKOUT output signal. The updated CKOUT signal is provided to the latch circuit 155. Again, the CKOUT signal is employed by the A/D converter to adjust the phase of its clock such that the image signals can be displayed with continuously updated phase alignment.

In summary, the present invention discloses a clock recovery system for aligning a clock-phase with RGB signals. The clock recovery system includes a voltage transition detector 145 for detecting consecutive voltage transitions from receiving the RGB signals. The clock recovery system further includes a phase sampler 150, for applying the voltage transitions for aligning the clock-phase with the RGB signals. In a preferred embodiment, the clock-phase is aligned to a phase angle of 180Y of a RGB signal cycles. In another preferred embodiment, the clock recovery system further includes a phase shift-direction detector 160. The phase shift-direction detector 160 receives the CKOUT signal and the voltage transition detected by the transition detector 145. The phase shift-direction detector 160 compares and determines the phase deviation between the CKOUT and the phase detected by the transition detector 145 directly from the digitized RGB signals. The clock recovery system further includes a digital digital phase lock loop (PLL) including the digital loop filter 165, the phase shift shift-direction detector 160 and the three-way multiplex controller 135. The phase difference detected by the phase shift-direction detector (PD) is inputted to the digital loop filter 165 to generate a phase segment selection input signal.

Figure 2:
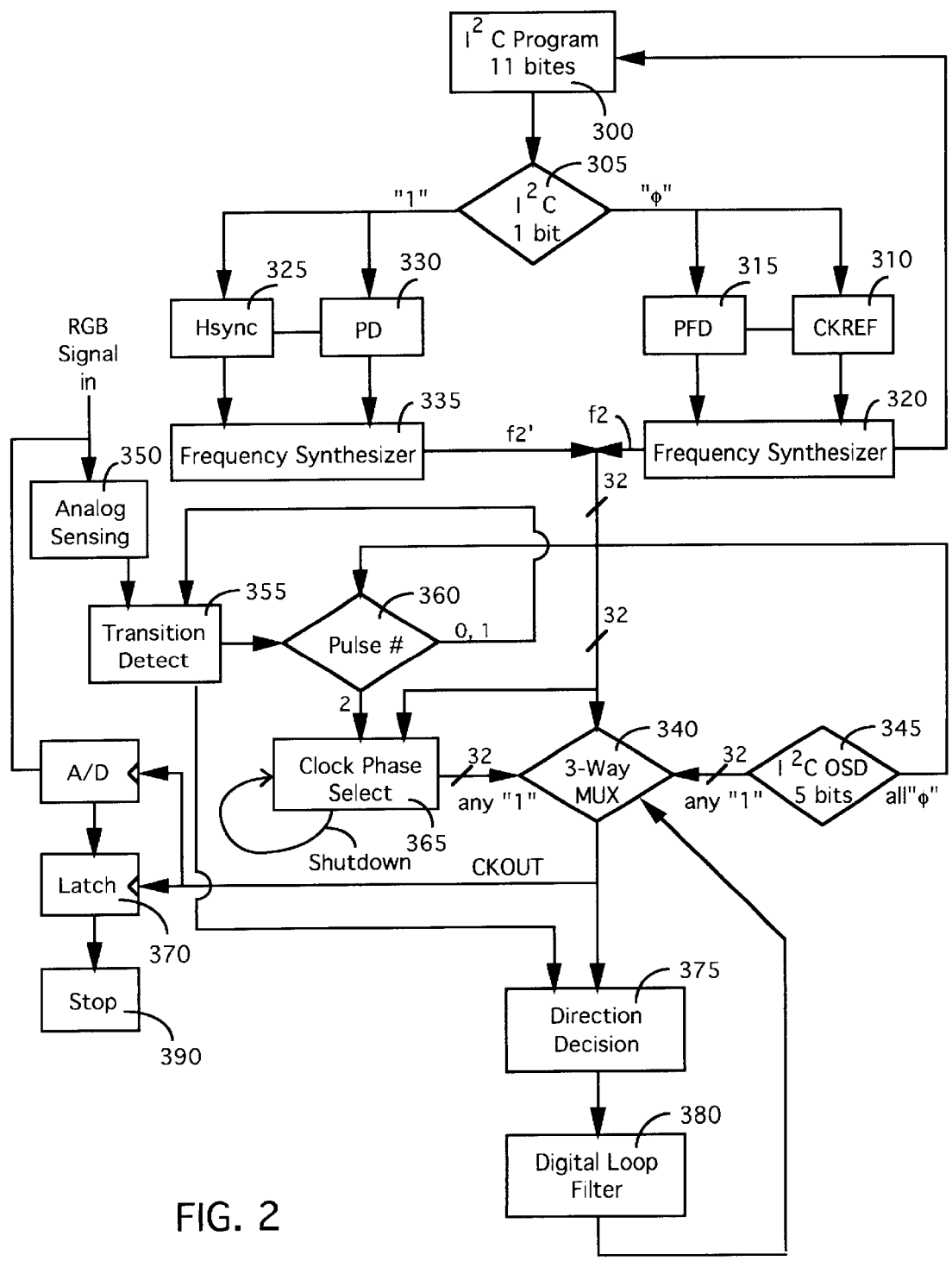
FIG. 2 is a flow chart for illustrating the functional steps performed by the clock recovery system of FIG. 1.

FIG. 2 is a flow chart for illustrating the processing steps of the clock recovery system 100. The process begins with the reception of an eleven-bit input of (M, N, R) from the I2C bus (step 300) where M, N, and R are integer parameters. A determination is then made of a one-bit I2C bus input of a fine-tuning bit to evaluate if that one-bit input is zero or one (step 305). If the one-bit input is zero, then an input of reference clock frequency CKREF is read (step 310) and a phase-frequency difference (PFD) detection (step 315) employed to perform a frequency synthesis by applying a frequency synthesizer (step 320). On the other hand, if the one-bit I2C bus input is one, then an input of horizontal synchronization signal (HSYNC) is read (step 325). And, a phase difference (PD) detection is performed (step 330) to generate a fine tune the phase and produce a fine-tuned synthesized frequency (step 335) with phase aligned with the HSYNC. In carrying out the frequency synthesis applying the CKREF (step 320) or fine-tuning the frequency-phase to align with the HYSNC (step 335), the each cycle is subdivided into a plurality of phase-segments, e.g., 32 phase-segments. These thirty-two phase-segments are inputted to a three-way multiplex controller (step 340) where further processes are carried out by the clock recovery system 100 to select one among these thirty-two phase segments.

For selection of one of these thirty-two phase segments to align the phase of the system clock, an option is provided for a user to make an on-screen-selection (OSD) input through a five-bit I2Cinput. A determination is made first to evaluate if the five-bit input is a non-zero value (step 345). If the five-bit input is a non-zero OSD value, then the three-way multiplex controller employs the OSD non-zero value for aligning the system clock to the selected OSD phase-segment This selected OSD phase-segment becomes an overriding output value CKOUT for inputting to a latch-circuit for latching to the selected phase segment.

If there an OSD selection is not made, then the OSD value is zero and the clock recovery system 100 carries out an automatic phase alignment by checking the number of pulses generated from RGB signals (see step 360 below). Making use of the digitized RGB signals generated from an analog sensor 142 (step 350), the clock system recovery system performs the automatic phase alignment. A transition detector receives the digitized RGB signals to detect a signal pulse generated from the RGB signals (step 355). A determination is made to check number of pulses generated by the transition detector (step 360). When there is no pulse generated or when there is only one-pulse received from the transition detector, the process of checking the number of pulses (step 360) is re-iterated. When two pulses are generated from the transition detector, the times of these two pulses are inputted to a clock phase selection circuit for selecting a RGB phase. After the RGB phase is generated the clock phase selection circuit is shutdown. The selected phase is provided to the three-way multiplex controller to provide a selected phase-segment as the CKOUT for latching and aligning the RGB signals to that phase segment (step 370). It is to be specially noted that the phase alignment of the RGB signal is carried out at the center, i.e., at 180Y phase angle, of the RGB signal cycle to allow greater tolerance of phase margins when there is a phase shift of the RGB signals. Phase margins are necessary because the RGB signals can be LSB, MSB, or full scale signals, error tolerance must be provided for not detecting the signal transitions representing a RGB signal cycle. Phase shifts of RGB signals often occur due to small random variations in frequency and phase accumulated over time during continuous long-time signal processing and transmission.

In addition to the automatic phase alignment by directly detecting the timing of the RGB signals, a continuous monitoring of the phase drift under various conditions under long-term operation is also carried out. The selected phase segment CKOUT and the detected RGB pulses are also inputted to a phase detector for determining the phase deviations of the CKOUT with the RGB pulses (step 375). The phase difference is then processed by a digital loop filter (step 380) to produce an updated phase segment selection for inputting to the three-way multiplex controller to shift the CKOUT signal at one left or right phase segment as a dynamically updated phase alignment signal. In addition to the phase alignment to the RGB pulses, the shift of frequency is also continuously monitored and adjusted by applying the HSYNC signals through the steps of steps 325 and 330 as described above.

The clock recovery system of this invention is provided to first generate a synthesized frequency (f2) based on the CKREF signals provided from the I2C bus and f2 is not equal to f1. The synthesized frequency is then tuned (f2') to be phase aligned with the HYSNC signal where f2' is approximately equal to f1. However, it is recognized that there is a phase difference between the HYSNC data and the RGB signals (f1). The transitions from receiving the RGB signals are then detected and a phase signal is generated based on the transitions detected according to the transmission and reception of the RGB data. Continuous alignment of the phase and frequency of the A/D converter to the detected RGB phase signal, i.e., making $\Delta f2'$ approximately equal to $\Delta f1$, are carried out by the clock recovery system through the left or right phase-segment shift by changing the $\Delta$CKOOUT. The timing and frequency of video RGB signal receptions for performing the LCD image display can therefore be precisely controlled. The uncharacterized phase and frequency shifts due to random variations and deviations of signal transmission, reception, and jitters as that encountered in the prior art can therefore be eliminated.

According to FIG. 2 and above description, this invention also discloses a method of processing red-green-blue (RGB) analog signals for converting said RGB analog signals to corresponding digital signals for image display. The method includes the steps of a) receiving a reference clock (CKREF) signal as a digital signal (step 310); b) generating a synthesized frequency (f2) by applying a phase-locking operation for locking a phase of the synthesized frequency with the reference clock (CKREF) signal (step 320); c) receiving horizontal synchronization (HSYN) signals as digital signals (step 325) and generating a fine-tuned synthesized frequency (f2') by performing a phase locking operation to lock a phase of the fine tuned synthesized frequency with the HSYN signals (step 335); d) dividing the fine-tuned synthesized frequency (f2') into N'-equal phase-segments where N' is a positive integer; e) detecting at least two voltage transitions from receiving a series of the RGB analog signals (step 355) and generating a clock-phase select signal (step 365) for automatically selecting an auto-selected phase-segment among the N'-equal phase-segments for align the fine-tuned synthesized frequency (f2') to the phase-segment (step 370); and f) periodically detecting at least two voltage transitions from receiving a series of the RGB analog signals after a predefined elapsed-time (step 355) and generating a dynamic clock-phase select signal (step 380) for periodically selecting an auto-selected phase-segment among the N-equal phase-segments for align the fine-tuned synthesized frequency (f2') to the phase-segment (step 370). In a preferred embodiment, the method further includes a step of g) providing a static phase adjusting means to allow a user to latch the fine-tuned synthesized frequency (f2') to a selected phase segment among the N'-equal phase-segments.

Figure 3:
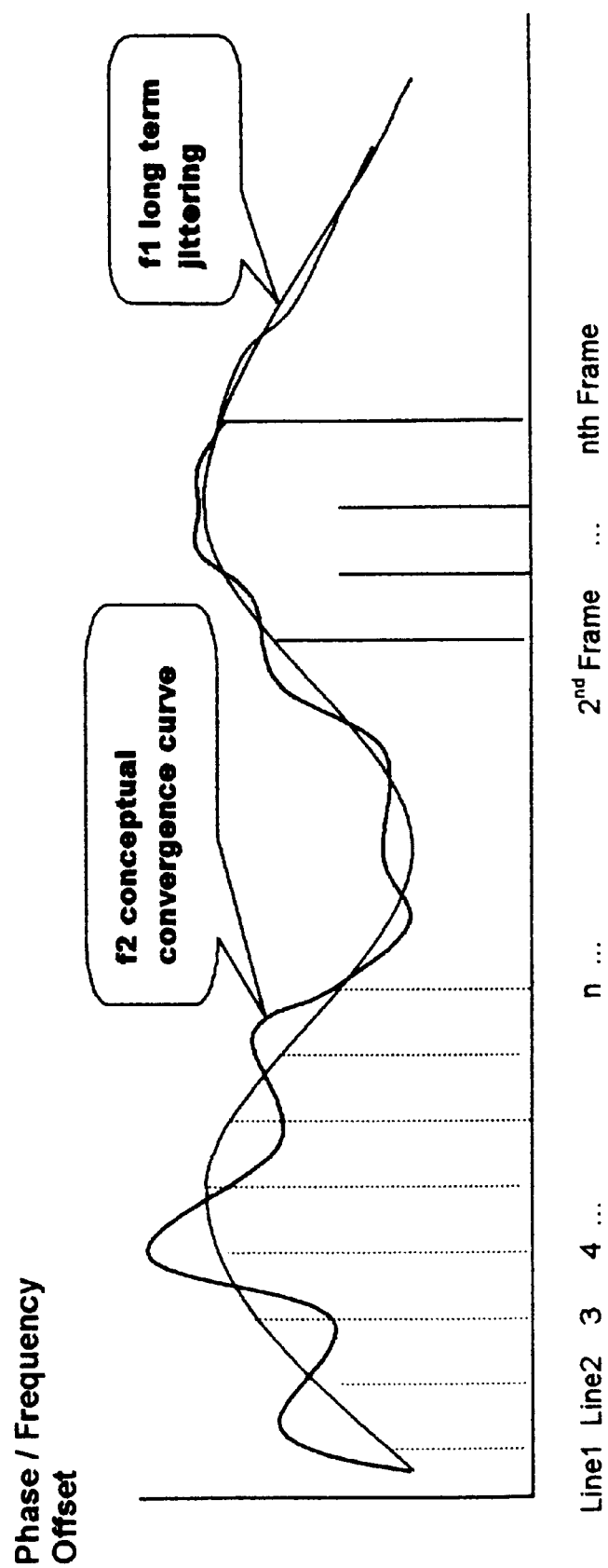
FIG. 3 is a diagram for illustrating dynamic phase adjustment performed by the time recovery system of this invention to continuously monitor and periodically adjust the phase of the clock to achieve f2 convergence.

FIG. 3 illustrates the adjustment and convergence of the clock frequency f2 of the A/D converter to the frequency f1 of the graphic card of a personal computer continuously sending the RGB analog signals for image display. The main curve shows the variation of the jitter amplitude $\Delta f1$ of the frequency f1. In the mean time, as the frequency f1 fluctuates and jitters, the frequency f2 is adjusted accordingly through the process of dynamic phase alignment process performed by the digital phase lock loop (PLL). Along the time line represented by the X-axis, there are thousands of f1 clock cycles and an RGB signal is transmitted in each clock cycle. In some periods of time, e.g., busy periods, there are great number of RGB signals transmitted while in other periods of time, e.g., quiet periods, there are only few RGB signals being transmitted. There is tendency that faster convergence of frequency f2 to frequency f1 is achievable because more data are available. Through several frames of RGB transmissions, e.g., n frames, the frequency f2 is gradually adjusted and converged to the frequency f1.

Therefore, this invention provides a new clock recovery system without relying on clock signals provided from a RAMDAC card such that difficulties and limitations caused by uncharacterized parameters in the prior art are resolved. Specifically, the present invention provides a new configuration and method for a clock recovery system where the phase and frequency are determined by employing the real time image data. The uncertainties and distortions caused by phase and frequency drifts and deviations caused by phase-difference between real-time analog data and local generated clock for A/D converter are eliminated. An automatic phase alignment to the incoming RGB signals are performed dynamically and automatically. The technical difficulties leading to poor quality of video images caused by the uncharacterized parameters are therefore eliminated. The automatic phase alignment to the incoming RGB signals and HSYNC is performed at 180-degree to allow more phase variation due to inaccurate frequency from the RAMDAC clock and the variations of RGB signals provided by different types of A/D converters . Greater tolerances for RAMDAC frequency inaccuracies are provided without causing additional deviations of phase alignment within the greater tolerance limits. Furthermore, the automatic phase alignment to the incoming RGB signals and HSYNC are continuously performed dynamically and automatically. Conventional on-screen-selection (OSD) to align the phase by a manual tuning is no longer necessary and can be provided only as an option. The manual phase tuning can be provided to override the automatically phase alignment according to a user's preference if an OSD option is selected.

Although the present invention has been described in terms of the presently preferred embodiment, it is to be understood that such disclosure is not to be interpreted as limiting. Various alternations and integrated circuit (IC) implementations for each functional block and modifications will no doubt become apparent to those skilled in the art after reading the above disclosure. Accordingly, it is intended that the appended claims be interpreted as covering all alternations, modifications and algorithms and circuit implementations as fall within the true spirit and scope of the invention.

I claim:

1. A clock recovery system for aligning a clock-phase with RGB signals comprising:
    a frequency synthesizing loop for receiving a reference clock signal (CKREF) to generate a synthesized frequency;
    a fine-tuned frequency synthesizing loop for receiving a horizontal synchronization signal (HSYNC) to fine tune said synthesized frequency into a fine-tuned synthesized frequency;
    a phase divider for subdividing said fine-tuned synthesized frequency into a multiple phase segments for inputting to said multiplex controller;
    a multiplex controller for receiving said multiple phase-segments subdivided;
    an analog sensor for receiving and sensing said RGB signals for generating encoded sensing data corresponding to voltage transitions of said RGB signals;
    a transition detection means for applying said encoded sensing data for generating transition-detection data;
    a threshold triggering circuit for comparing said transition-detection data with a threshold data and triggering a RGB-phase data upon detecting said threshold data is exceeded by said transition detection data;
    a phase sampling means for applying said RGB-phase data for selecting a clock-alignment phase-segment from one of said multiple phase segments received from said multiplex controller for aligning said clock-phase;
    a digital phase-lock loop (PLL) includes a phase shift-direction detector (PD) for receiving said RGB-phase data from said threshold triggering circuit and said clock-alignment phase-segment from said multiplex controller for generating a dynamic phase-shift difference; and
    said digital PLL further includes a digital filter for receiving said dynamic phase-shift difference from said digital PD for generating a phase-segment-shift signal for outputting to said multiplex controller for shifting said clock-alignment phase-segment to dynamically align said clock-phase.

2. The clock recovery system of claim 1 further comprising:
    a manual on-screen adjustment (OSD) means provided for user selection of said clock-alignment phase segment for inputting to said multiplex controller.

3. The clock recovery system of claim 1 further comprising:
    a latch circuit receiving said clock-alignment phase-segment from said multiplex controller for aligning and latching a clock of an A/D converter to said clock-alignment phase-segment.

4. A clock recovery system for aligning a clock-phase with RGB signals comprising:
    an analog sensor for receiving and sensing said RGB signals for generating encoded sensing data corresponding to voltage transitions of said RGB signals;
    a transition detection means for applying said encoded sensing data for generating transition-detection data;
    a threshold triggering circuit for comparing said transition-detection data with a threshold data and triggering a RGB-phase data upon detecting said threshold data is exceeded by said transition detection data;
    a multiplex controller for receiving a multiple phase-segments subdivided from a clock frequency cycle; and
    a phase sampling means for applying said RGB-phase data for selecting a clock-alignment phase-segment from one of said multiple phase segments received from said multiplex controller for aligning said clock-phase.

5. The clock recovery system of claim 4 further comprising:
    a fine-tuned frequency synthesizing loop for receiving a horizontal synchronization signal (HSYNC) to synthesized a fine-tuned synthesized frequency; and
    a phase divider for subdividing said fine-tuned synthesized frequency into said multiple phase segments for inputting to said multiplex controller.

6. The clock recovery system of claim 5 further comprising:
    a phase-lock loop (PLL) includes a phase shift-direction detector (PD) for receiving said RGB-phase data from said threshold triggering circuit and said clock-alignment phase-segment from said multiplex controller for generating a dynamic phase-shift difference; and said digital PLL further includes a digital filter for receiving said dynamic phase-shift difference from said PD for generating a phase-segment-shift signal for outputting to said multiplex controller for shifting said clock-alignment phase-segment to dynamically align said clock-phase.

7. The clock recovery system of claim 4 further comprising:

a frequency synthesizing loop for receiving a reference clock signal (CKREF) to generate a synthesized frequency; and a phase divider for subdividing said synthesized frequency into said multiple phase segments for inputting to said multiplex controller.

8. A clock recovery system for aligning a clock-phase with RGB signals comprising:

a voltage transition detector for detecting voltage transitions from said RGB signals; and a phase sampling means for applying said voltage transitions for determining an optimal phase segment for aligning said clock-phase with said RGB signals.

9. The clock recovery system of claim 8 further comprising:

a digital phase-lock loop (PLL) includes a phase shift-direction detector (PD) for receiving said voltage transitions from said voltage transition detector and said optimal phase segment from said phase sampling means for generating a dynamic phase-shift difference for shifting said optimal phase segment for dynamically aligning said clock-phase with said RGB signals.

10. A method of processing red-green-blue (RGB) analog signals for converting said RGB analog signals to corresponding digital signals for image display comprising:

a) receiving a reference clock (CKREF) signal as a digital signal;

b) generating a synthesized frequency (f2) by applying a phase-locking operation for locking a phase of said synthesized frequency with said reference clock (CKREF) signal;

c) dividing said synthesized A/D frequency (f2) into N-equal phase-segments where N is a positive integer; and d) providing a static phase adjusting means to allow a user to align said synthesized frequency (f2) to align with an on-screen adjustment (OSD) user-selected phase segment among said N-equal phase-segments.

11. The method of claim 10 further comprising:

e) receiving horizontal synchronization (HSYNC) signals as digital signals and generating a fine-tuned synthesized frequency (f2') by performing a phase locking operation to lock a phase of said fine tuned synthesized frequency with said HSYNC signals;

e') dividing said fine-tuned synthesized frequency (f2') into N'-equal phase-segments where N' is a positive integer; and f') providing a static phase adjusting means to allow a user to align said fine-tuned synthesized frequency (f2') to align with an on-screen adjustment (OSD) user-selected phase segment among said N'-equal phase-segments.

12. The method of claim 10 further comprising:

d") dividing said synthesized frequency (f2) into N-equal phase-segments where N is a positive integer; and f') detecting at least two voltage transitions from receiving a series of said RGB analog signals and generating a clock-phase select signal for automatically selecting an auto-selected phase-segment among said N-equal phase-segments for align said synthesized frequency (f2) to said phase-segment.

13. The method of claim 11 further comprising:

d'") dividing said fine-tuned synthesized frequency (f2') into N'-equal phase-segments where N' is a positive integer; and f") detecting at least two voltage transitions from receiving a series of said RGB analog signals and generating a clock-phase select signal for automatically selecting an auto-selected phase-segment among said N'-equal phase-segments for align said fine-tuned synthesized frequency (f2') to said phase-segment.

14. The method of claim 12 further comprising:

g) periodically detecting voltage transitions from receiving a series of said RGB analog signals after a pre-defined elapsed-time and generating a dynamic clock-phase select signal for periodically selecting an auto-selected phase-segment among said N-equal phase-segments for align said synthesized frequency (f2) to said phase-segment.

15. The method of claim 13 further comprising:

g') periodically detecting voltage transitions from receiving a series of said RGB analog signals after a pre-defined elapsed-time and generating a dynamic clock-phase select signal for periodically selecting an auto-selected phase-segment among said N-equal phase-segments for align said N'-equal phase-segments for align said fine-tuned synthesized frequency (f2') to said phase-segment.

16. A method for aligning a phase of a clock with RGB signals comprising:

a) receiving said RGB signals and detecting voltage transitions of said RGB signals; and b) performing a phase sampling by applying said voltage transitions and aligning said phase of said clock with said RGB signals.

17. The method for aligning a cock-phase with RGB signals of claim 16 further comprising a step of:

a1) receiving an HSYNC data for determining a frequency for said clock.

* * * * *